(12) United States Patent
Kim

(10) Patent No.: US 9,846,202 B2
(45) Date of Patent: Dec. 19, 2017

(54) DEGRADATION ESTIMATION METHOD FOR HIGH VOLTAGE BATTERY

(71) Applicants: Hyundai Motor Company, Seoul (KR); Kia Motors Corporation, Seoul (KR)

(72) Inventor: Woo Sung Kim, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 611 days.

(21) Appl. No.: 14/096,828

(22) Filed: Dec. 4, 2013

(65) Prior Publication Data

US 2015/0057957 A1    Feb. 26, 2015

(30) Foreign Application Priority Data

Aug. 23, 2013    (KR) .................. 10-2013-0100059

(51) Int. Cl.
*G01R 31/36*    (2006.01)
*B60L 11/18*    (2006.01)
*H02J 7/00*    (2006.01)

(52) U.S. Cl.
CPC ...... *G01R 31/3679* (2013.01); *B60L 11/1857* (2013.01); *H02J 7/0047* (2013.01); *B60L 2200/10* (2013.01); *B60L 2200/18* (2013.01); *B60L 2200/32* (2013.01); *B60L 2240/545* (2013.01); *B60L 2240/547* (2013.01); *B60L 2240/549* (2013.01); *H02J 2007/005* (2013.01); *Y02T 10/705* (2013.01); *Y02T 10/7011* (2013.01)

(58) Field of Classification Search
CPC ................ G01R 31/3679; H02J 7/0047; H02J 2007/005; Y02T 10/7005; Y02T 10/705; Y02T 10/7001; B60L 11/1857; B60L 2200/10; B60L 2200/18; B60L 2200/32; B60L 2240/545; B60L 2240/549
USPC .......................................................... 702/63
See application file for complete search history.

(56) References Cited

U.S. PATENT DOCUMENTS

| | | | |
|---|---|---|---|
| 9,046,586 B2 * | 6/2015 | Yuasa | G01R 31/3679 |
| 2004/0222769 A1 * | 11/2004 | Al-Anbuky | H02J 7/0072 320/128 |
| 2013/0151183 A1 * | 6/2013 | Nam | G01R 31/3679 702/63 |

FOREIGN PATENT DOCUMENTS

| | | |
|---|---|---|
| JP | 2005-345135 A | 12/2005 |
| JP | 2012-235551 A | 11/2012 |
| KR | 10-2007-0105014 A | 10/2007 |
| KR | 10-2008-0066794 A | 7/2008 |
| KR | 10-2011-0134019 A | 12/2011 |

(Continued)

*Primary Examiner* — Bryan Bui
(74) *Attorney, Agent, or Firm* — Mintz Levin Cohn Ferris Glovsky and Popeo, P.C.; Peter F. Corless

(57) ABSTRACT

A degradation estimation method system of a high voltage battery is provided that detect degradation of a battery. The degradation estimation method includes obtaining, by a controller, information about an input voltage, an input current and an external temperature of a slow charger. The controller is configured to calculate an output power used for charging the battery, based on an input power calculated based on the input voltage and the input current. In addition, the method includes calculating, by the controller, a mean charging current based on the output power and the battery charging voltage and calculating a battery degradation degree based on the mean charging current.

12 Claims, 4 Drawing Sheets

(56) References Cited

FOREIGN PATENT DOCUMENTS

| KR | 10-2012-0119801 A | 10/2012 |
|---|---|---|
| WO | 2011-121692 A1 | 10/2011 |

\* cited by examiner

DEGRADATION ESTIMATION METHOD FOR HIGH VOLTAGE BATTERY

CROSS-REFERENCE TO RELATED APPLICATION

This application claims under 35 U.S.C. §119(a) the benefit of Korean Patent Application No. 10-2013-0100059 filed Aug. 23, 2013, the entire contents of which are incorporated herein by reference.

BACKGROUND (a) Technical Field

The present disclosure relates to a method and system for accurately estimating degradation of a high voltage battery within an electric vehicle more accurately, a plug-in hybrid electric vehicle or the like.

(b) Background Art

Generally, a high voltage battery is loaded within an electric vehicle (EV), a plug-in hybrid electric vehicle (PHEV) or the like to store electric energy used as a driving force of the vehicles. When the high voltage battery is used continuously in succession, a degradation phenomenon occurs, thus decreasing the capacity of the battery. When degradation occurs, the accuracy of State Of Charge (SOC) also deteriorates, thereby reducing gas mileage per SOC, deterioration of power for acceleration, or the like.

For this reason, an attempt has been made to determine degradation of a battery by utilizing a battery voltage characteristic and SOC of an EV or PHEV during slow charging. In particular, during slow charging of a high voltage battery loaded within a vehicle, a change in rate of charging capacity with respect to a predetermined voltage change is calculated and compared with known data regarding change rates of charging capacity with respect to a predetermined voltage change during slow charging based on a degradation degree of a high voltage battery of the same specification to detect the corresponding degradation degree.

In a known technique, when detecting a degradation degree using the change of charging capacity in a predetermined voltage region, sensed current values are integrated to measure the change of charging capacity. Since a sensed charging current value is used, a measurement error of a current sensor may be applied, influencing the final degradation degree calculation result. In other words, since a value measured by a sensor is used as a current value for detecting degradation of a high voltage battery in the known technique, an error of the current sensor is applied as an error of the degradation degree. Therefore, when the sensor error increases, the calculated degradation degree also has an increased error.

During the slow charging of a high voltage battery, a slow charger receives power from an external power source to charge the vehicle battery. Therefore, the charging current may vary according to specifications of the input power (e.g., output specifications). Therefore, in the known technique, degradation may be detected in the power source having predetermined specifications.

The above information disclosed in this section is only for enhancement of understanding of the background of the invention and therefore it may contain information that does not form the prior art that is already known in this country to a person of ordinary skill in the art.

SUMMARY

The present invention provides a degradation estimation method and system of a high voltage battery, which may detect degradation of a battery and a degradation degree more accurately during slow charging of a high voltage battery using a more accurate current value in comparison to an existing method using a measured current value to which an error is applied (generated) by a sensor, since a mean current applied to the battery during charging is calculated using a battery charging voltage with respect to the output power which is output by a charger to charge the battery.

In an aspect of the present disclosure, a degradation estimation method of a high voltage battery may include: obtaining information regarding an input voltage (Vin), an input current (Iin) and an external temperature of a slow charger; calculating an output power (Pout) used for charging the battery, based on an input power (Pin) calculated based on the input voltage (Vin) and the input current (Iin); calculating a mean charging current (Icorr) based on the output power (Pout) and the battery charging voltage (Vbatt); and calculating a battery degradation degree based on the mean charging current (Icorr).

The calculation of the output power may include: obtaining efficiency with respect to the external temperature of the slow charger; and calculating an output power (Pout) by multiplying the efficiency and the input power (Pin). The efficiency with respect to the external temperature of the slow charger may be read from a table which has an external temperature as an input and efficiency of the slow charger as an output. In addition, in the present disclosure, in the calculation of the mean charging current, the mean charging current (Icorr) may be calculated by: [the output power (Pout)/the battery charging voltage (Vbatt)]×the efficiency of the slow charger.

The calculation of the battery degradation degree may include: calculating a current charging capacity (Ah_aged) based on the mean charging current (Icorr); and calculating a battery degradation degree based on the current charging capacity (Ah_aged). The current charging capacity (Ah_aged) may be calculated by integrating a mean charging current (Icorr) in a voltage region similar to an initial charging stage of the battery. In addition, the battery degradation degree may be calculated by: 100−[(the current charging capacity (Ah_aged)/an initial charging capacity (Ah_initial))×100]. Further, the information may be obtained when the battery charging voltage (Vbatt) enters a predetermined voltage region during the slow charging.

In another aspect of the present invention, a degradation estimation method of a high voltage battery may include: obtaining information regarding an output voltage (Vout) and an output current (Iout) of a slow charger; calculating an output power (Pout) of the slow charger by using the output voltage (Vout) and the output current (Iout); calculating a mean charging current (Icorr) with respect to the calculated output power (Pout); and calculating a battery degradation degree based on the mean charging current (Icorr).

In the calculating of the mean charging current, the mean charging current (Icorr) with respect to the output power (Pout) may be read from a map prepared in advance, and the map may use an output power (Pout) as an input and a mean charging current (Icorr) as an output. For example, the map may be configured to calculate a mean charging current (Icorr) using the battery charging voltage (Vbatt) obtained through a slow charging test of different high voltage batteries which have been degraded and the output power (Pout) and the efficiency of the slow charger, and the mean charging current (Icorr) may be read as an output for the output power (Pout).

In addition, the calculation of the battery degradation may include: calculating a current charging capacity (Ah_aged)

based on the mean charging current (Icorr); and calculating a battery degradation degree based on the current charging capacity (Ah_aged). The degradation estimation method of a high voltage battery according to an exemplary embodiment of the present disclosure has the following advantages.

1. Since an accurate charging capacity may be calculated using a mean charging current (Icorr) obtained by correcting a current value sensed by a current sensor, even though a more precise current sensor in comparison to an existing technique is not used, it may be possible to detect degradation with higher precision using an accurate charging capacity, and it may also be possible to reduce costs of a controller.

2. Since battery degradation may be detected based on the mean charging current (Icorr), a degradation degree may be detected regardless of specifications of charging power (input power).

3. It may be possible to improve accuracy of actual SOC and ensure a more stable running state of a vehicle since degradation of a high voltage battery loaded in an EV, a PHEV or the like may be estimated more accurately.

BRIEF DESCRIPTION OF THE DRAWINGS

The above and other objects, features and advantages of the present disclosure will become apparent from the following description of certain exemplary embodiments given in conjunction with the accompanying drawings, in which.

Figure 1:
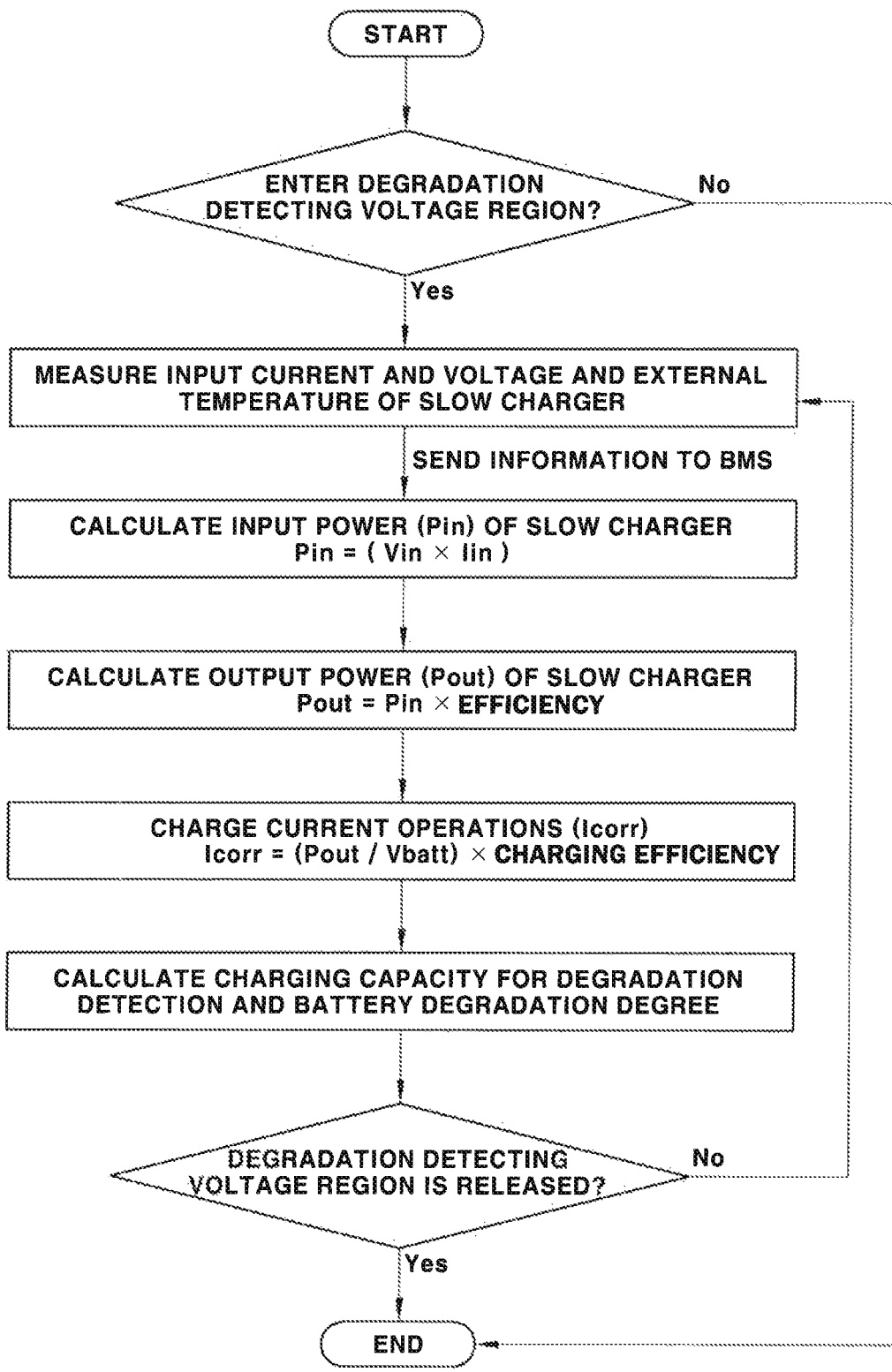
FIG. 1 is an exemplary diagram showing a degradation estimation method of a high voltage battery according to an exemplary embodiment of the present disclosure.

It should be understood that the appended drawings are not necessarily to scale, presenting a somewhat simplified representation of various exemplary features illustrative of the basic principles of the invention. The specific design features of the present invention as disclosed herein, including, for example, specific dimensions, orientations, locations, and shapes will be determined in part by the particular intended application and use environment. In the figures, reference numbers refer to the same or equivalent parts of the present invention throughout the several figures of the drawing.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles, fuel cell vehicles, and other alternative fuel vehicles (e.g., fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter reference will now be made in detail to various exemplary embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

The present disclosure is directed to a method for detecting degradation of a high voltage battery (e.g., a high voltage lithium battery) loaded within an electric vehicle (EV), a plug-in hybrid electric vehicle (PHEV) or the like, and characterized in that the degradation detection performance of a battery cell may be enhanced by detecting degradation of a high voltage battery based on a corrected charging current, namely a mean charging current, obtained by improving accuracy of currents measured by a current sensor during the slow charging.

In this regard, when detecting degradation of a high voltage battery for an EV or a PHEV, a mean charging current applied to a battery may be calculated using a battery charging voltage during the slow charging, and battery degradation may be detected based on the mean charging current. In other words, in a vehicle system such as an electric vehicle which performs slow charging by receiving an input power from an external power source, the degradation estimation method of a high voltage battery according to an exemplary embodiment of the present disclosure may calculate a mean measured current by correcting a battery charging current measured by a sensor based on a battery charging voltage when a slow charger loaded within the vehicle charges a high voltage battery with power received from the external power source, and may detect battery degradation by calculating a current charging capacity based on the calculated mean average current.

As shown in FIG. 1, to calculate a mean charging current (Icorr) by correcting a charging current (e.g., a battery current value measured by a sensor), the degradation estimation method of a high voltage battery according to an exemplary embodiment of the present disclosure may include: recognizing (e.g., by a sensor) information regarding an input current (Iin), an input voltage (Vin) and a charger environment temperature (e.g., an external temperature) of a slow charger, supplied from the exterior (e.g., extraneous to the vehicle), transmitting the information to a battery management system (BMS) loaded within a vehicle (e.g., transmitting to a controller), calculating, by a controller, an output power (Pout) used for battery charging using the information transmitted to the battery management system, and calculating, by the controller, a mean charging current using the output power (Pout) calculated by the battery management system (e.g., controller).

Prior to recognizing the information regarding the environment temperature of the slow charger or the like, whether the battery charging voltage enters a voltage region arbitrarily selected for detecting degradation during the slow charging may be determined by the controller. In the present disclosure, since battery degradation may be detected based on the calculated mean charging current (Icorr), the voltage region for detecting degradation may be determined arbitrarily.

Figure 3:
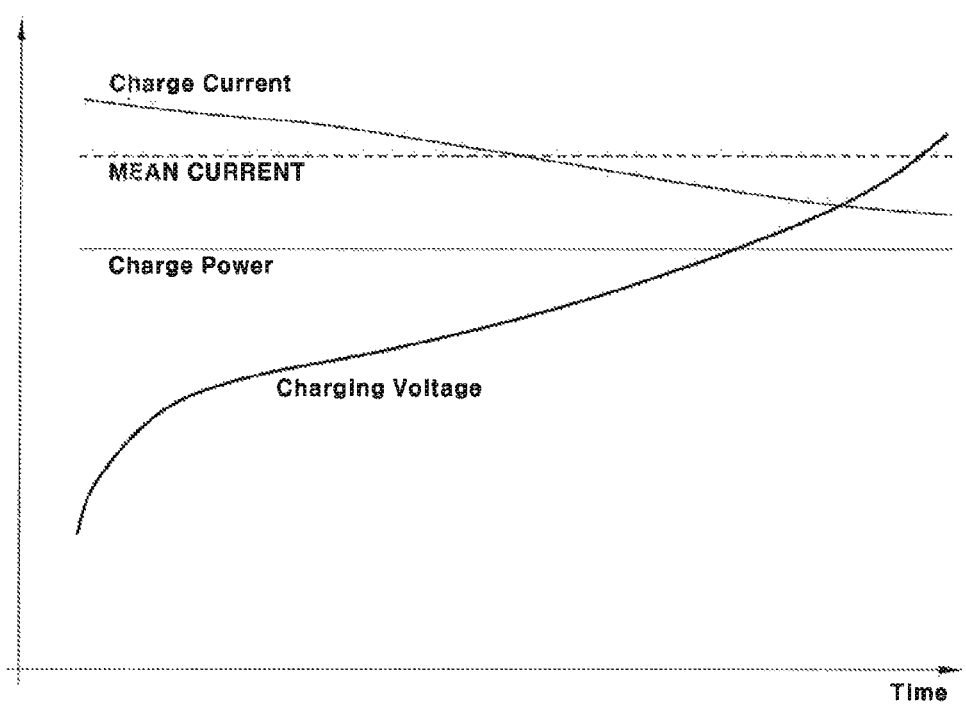
FIG. 3 is an exemplary diagram showing voltage and current characteristics appearing during the slow charging for detecting degradation of a high voltage battery according to an exemplary embodiment of the present disclosure.

For reference, as shown in FIG. 3, for the high voltage battery loaded within an electric vehicle or a plug-in hybrid electric vehicle, as the slow charging progresses (e.g., as the charging time passes), a charging voltage may gradually increase and a charging current may gradually decrease. The charging power may be maintained at a constant value. As a result of the determination, in response to determining that the battery charging voltage enters a voltage region for detecting degradation during the slow charging, that is, when the battery charging voltage enters a voltage region for detecting degradation during the slow charging, an input current (Iin), an input voltage (Vin) and an external temperature of the slow charger may be measured and collected. The measured external temperature may be used when reading efficiency of the slow charger from a table prepared in advance. The table will be described later.

In the process of sensing information, when the slow charger loaded within a vehicle receives an external power, the input current (Iin) and the input voltage (Vin) supplied from the exterior may be recognized by measurement using a sensor, and the external temperature of the slow charger may be recognized by measurement using a temperature sensor disposed within the vehicle. In other words, sensors connected to the slow charger provide information that correspond to an input voltage (Vin) and an input current (Iin) supplied from an external power source and information that corresponds to an external temperature of a slow charger.

In the process of transmitting the information, the sensed information regarding the input current (Iin) and the input voltage (Vin) and the external temperature of the slow charger may be provided to the battery management system.

Further, the calculating power process, that is, calculating an output power (Pout) used for charging a battery, may include an input power calculating process, executed by the controller, that multiples the input current (Iin) and the input voltage (Vin) to calculate a power (e.g., input power, Pin) input to the slow charger, and an output power calculating process that multiplies the calculated input power (Pin) and the efficiency (see Table 1) based on the environment temperature of the slow charger to calculate an output power (Pout) used for charging a battery by the slow charger. The input power (Pin) may be calculated using values of the input voltage (Vin) and the input current (Iin) provided by sensors connected to the slow charger.

The efficiency according to the environment temperature of the slow charger, which may be used to calculate the output power, may use a value selected from a table, configured in advance, by mapping a relation between the environment temperature of the slow charger and the efficiency. For example, the table may be configured by slow-charging each high voltage battery under various environment temperature conditions with respect to output characteristics of the slow charger per each temperature to calculate efficiency of the slow charger and then averaging and mapping the efficiency per each environment temperature. Table 1 below is an example.

Therefore, efficiency based on the environment temperature of the slow charger may be selected and read from the table prepared in advance to calculate the output power (Pout). For example, when the environment temperature of the slow charger is about 20° C., the charging efficiency F % may be read, and the charging efficiency F % may be multiplied by the input voltage (Pin) to calculate the output power (Pout).

TABLE 1

| Temperature | −35° C. | −20° C. | −10° C. | 0° C. | 10° C. | 20° C. | 30° C. | 40° C. | 50° C. | 60° C. |
|---|---|---|---|---|---|---|---|---|---|---|
| Efficiency | A % | B % | C % | D % | E % | F % | G % | H % | I % | J % |

In particular, A to J in Table 1 respectively represent a mean value of efficiency of the slow charger calculated under various environment temperature conditions.

In addition, in mean current calculation, that is, the process of calculating a mean charging current (Icorr), the calculated output power (Pout) may be subtracted from a battery charging voltage (Vbatt) to calculate a mean value of the charging current (Ichar) of the battery charged by the slow charger, and then a current consumed by vehicle component loads during vehicle charging may be subtracted from the calculated charging current value (Ichar) to calculate a corrected charging current actually charged to the battery, that is, a mean charging current (Icorr).

When calculating the mean charging current (Icorr), to subtract a current used by vehicle component loads during battery charging from the battery charging current value (Ichar), the efficiency used above for calculating the output power (Pout) may be used. In other words, the mean charging current (Icorr) may be calculated as follows:

mean charging current(Icorr)=[output power(Pout)/
battery charging voltage (Vbatt)]×efficiency of
the slow charger In addition, a current charging capacity (Ah_aged) for detecting degradation of the battery and a degradation degree may be calculated based on the mean charging current (Icorr), and a battery degradation degree may be calculated based on the current charging capacity (Ah_aged). To calculate the battery degradation degree, first, an initial charging capacity (Ah_initial) in a predetermined voltage range may be measured at an initial charging stage of a battery cell and may be used as a reference value. During charging the battery cell after the initial charging, the calculated mean charging current (Icorr) may be integrated with respect to the same voltage range (e.g., the same voltage range as the initial charging stage) at charging of the battery cell to calculate the current charging capacity (Ah_aged), and then a battery degradation degree may be calculated using a ratio between the initial charging capacity (Ah_initial) and the current charging capacity (Ah_aged). Specifically, the battery degradation degree may be calculated as follows:

battery degradation degree (%)=100−[{current charg-
ing capacity(Ah_aged)/initial charging capacity
(Ah_initial)}×100]

Figure 4:
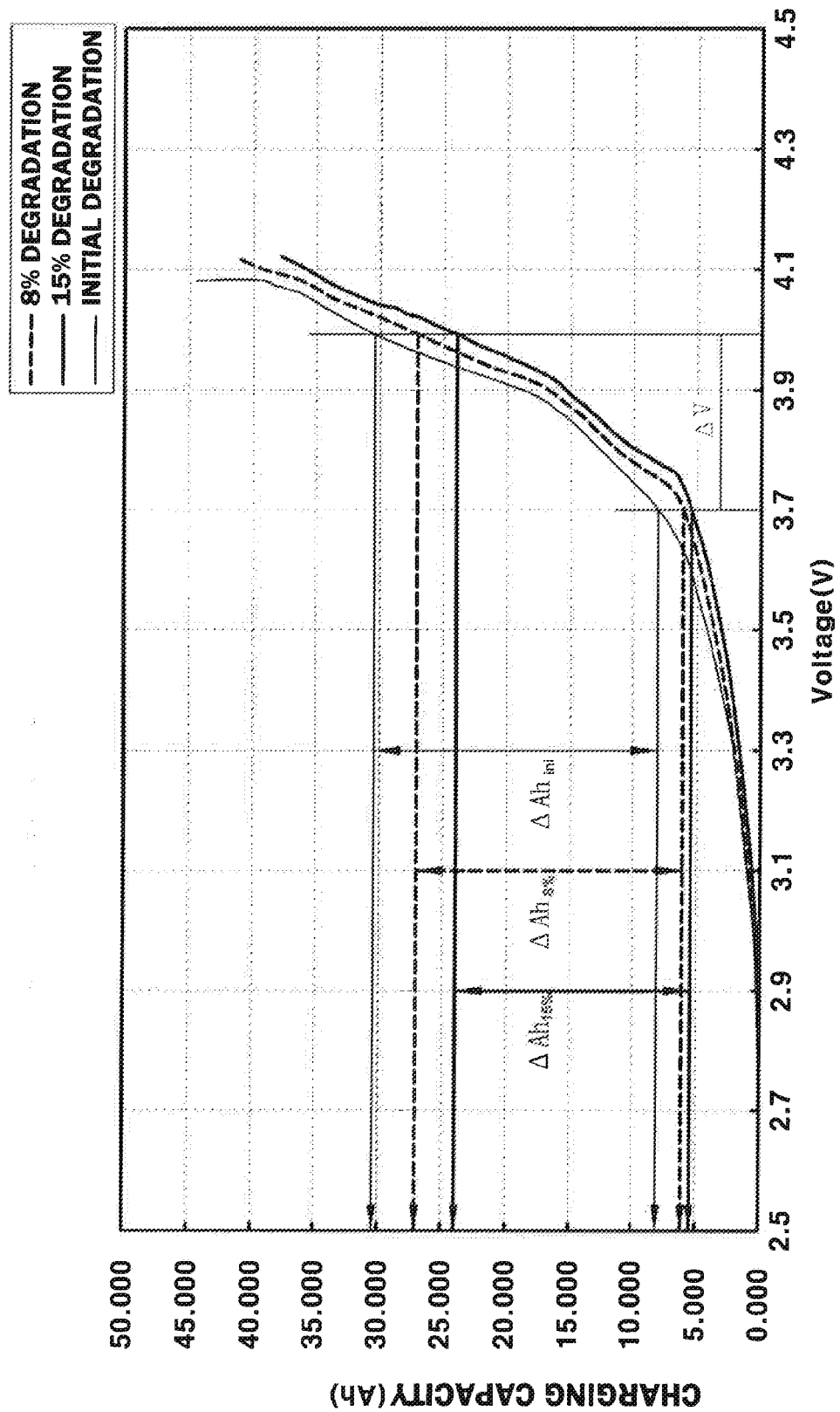
FIG. 4 is an exemplary diagram showing a charging voltage curve according to the degradation degree of a high voltage battery according to an exemplary embodiment of the present invention.

The above calculation of the battery degradation degree is based on a battery voltage characteristic at charging, as understood with reference to FIG. 4. As shown in FIG. 4, even though a battery may degrade, the charging voltage curve may be substantially similarly moving, but the charging capacity of the battery may decrease. Therefore, the battery degradation degree may be calculated by detecting a charging capacity change characteristic with respect to a predetermined voltage range.

As described above, the charging capacity for detecting degradation of the battery and the battery degradation degree may be calculated based on the mean charging current (Icorr), and the process of calculating the charging capacity and calculating and detecting the battery degradation degree may be performed in a voltage range arbitrarily selected and determined. Therefore, whether the battery charging voltage (Vbatt) maintains a state of entering the degradation-detecting voltage region may be determined. When the battery charging voltage (Vbatt) is beyond the voltage range, the battery degradation detecting process may end. Alternatively, when the battery charging voltage (Vbatt) is within the range, the process for detecting battery degradation may be repeated.

Further, to obtain the mean charging current (Icorr) applied to a battery during slow charging of a high voltage battery, the following method may also be used other than the above method for calculating an output power (Pout) during slow charging and calculating a mean charging current (Icorr) by using the output power (Pout).

Figure 2:
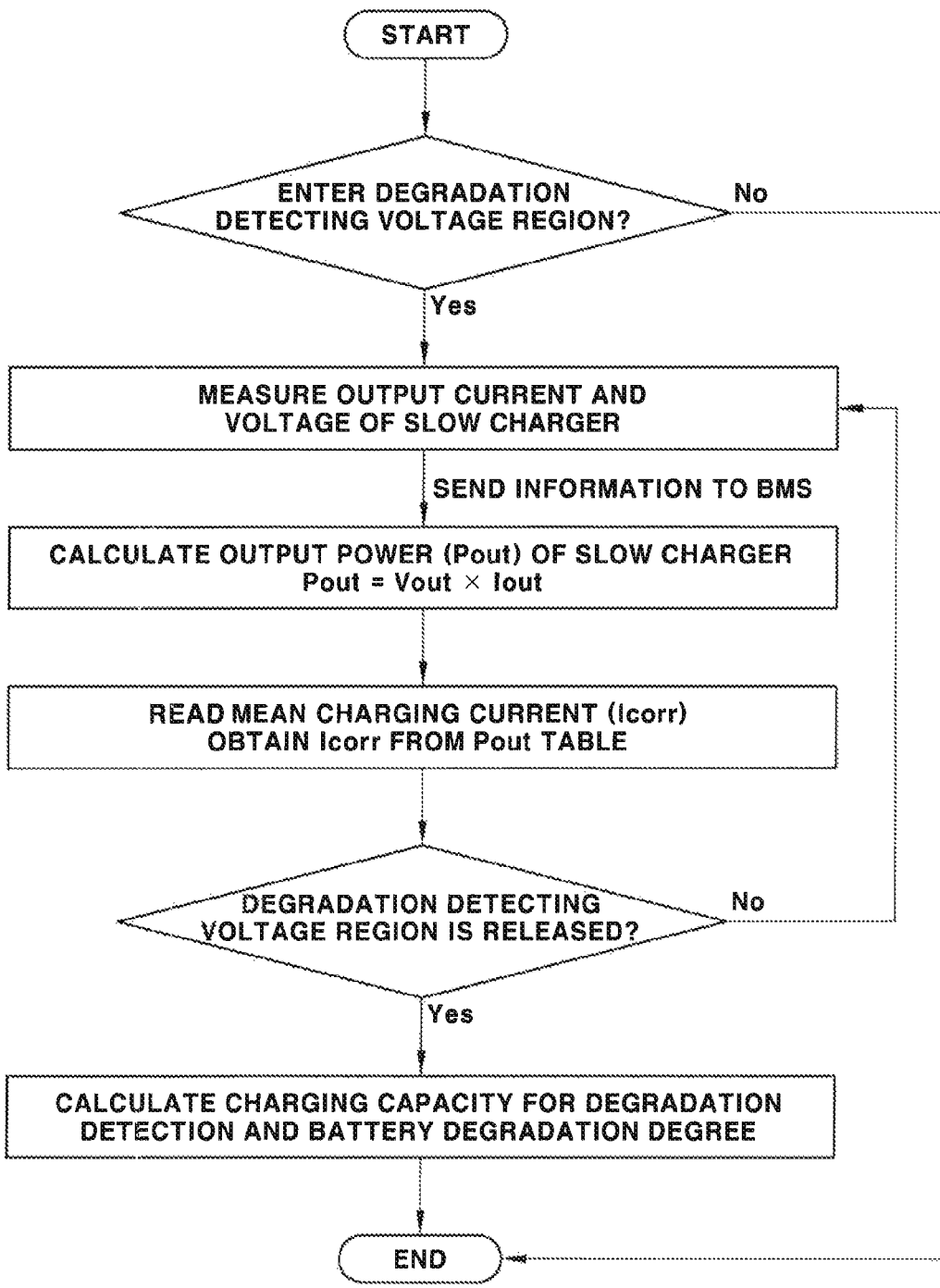
FIG. 2 is an exemplary diagram showing a degradation estimation method of a high voltage battery according to another exemplary embodiment of the present disclosure.

As shown in FIG. 2, to obtain a mean charging current (Icorr), an output voltage (Vout) and an output current (Iout) output by a slow charger may be multiplied to calculate an output power (Pout) of the slow charger, and then a mean charging current (Icorr) may be obtained using a correlation between the calculated output power (Pout) and the battery charging voltage (Vbatt). In addition, a battery degradation degree may be calculated based on the mean charging current (Icorr).

In particular, the output power (Pout) of the slow charger may be calculated by recognizing information regarding the output current (Iout) and the output voltage (Vout) of the slow charger supplied with an external power, transmitting the information to a battery management system (BMS) disposed within a vehicle, and calculating an output power (Pout) used for battery charging using the information transmitted to the battery management system. The output power (Pout) of the slow charger is a value that may be obtained by calculating power used for charging by the slow charger at an initial battery charging stage. The information including the information about the output voltage (Vout) and the output current (Iout) output for battery charging by the slow charger may be recognized by measurement using a sensor.

In addition, in calculating the output power calculating, an output power (Pout) may be calculated using the output voltage (Vout) and the output current (Iout), that is, by multiplying the output voltage (Vout) and the output current (Iout). A mean charging current (Icorr) may be obtained as a current value representing a correlation between the output power (Pout) and the battery charging voltage (Vbatt).

A map (see Table 2 below) for the output power (Pout) may be include the battery charging voltage (Vbatt) measured by a slow charging test in a predetermined voltage region arbitrarily selected for detecting a battery degradation degree and the mean charging current (Icorr) measured using the calculated output power (Pout), and a mean charging current (Icorr) with respect to an input output power (Pout) may be read and obtained from the map.

In other words, the map may calculate a mean charging current (Icorr) by considering the battery charging voltage (Vbatt) measured by a slow charging test of the high voltage battery, the calculated output power (Pout) and a current consumed by vehicle components during charging, and the calculated mean charging current (Icorr) may be read corresponding to each output power (Pout). The mean charging current (Icorr) of the map may be calculated as follows:

mean charging current(Icorr)=(Pout/Vbatt)×efficiency
of the slow charger

Therefore, the output power (Pout) may be calculated when the battery charging voltage (Vbatt) enters a voltage region arbitrarily selected for detecting battery degradation, and a mean charging current (Icorr) that corresponds to the calculated output power (Pout) may be read and obtained from the map prepared in advance.

TABLE 2

| Power(Pout)   | 1000 | 2000 | 3000 | 4000 | 5000 | 6000 | 7000 |
|---------------|------|------|------|------|------|------|------|
| Current(Icorr) | a    | b    | c    | d    | e    | f    | g    |

In Table 2, a to g are an average value of the mean charging currents (Icorr) obtained by a slow charging test of a high voltage battery at which degradation occurs in a predetermined voltage region arbitrarily selected.

A map (or, a table) similar to Table 2 may be configured by obtaining mean charging currents (Icorr) of high voltage batteries with respect to a predetermined voltage change in an arbitrarily-selected voltage region during slow charging of the high voltage batteries which may be degraded into different states and then storing the values as a table. The map may be stored in a battery management system of a vehicle.

The battery management system may be configured to calculate a charging capacity for detecting a battery degradation degree based on the mean charging current (Icorr) read with respect to the calculated output power (Pout), and calculate a battery degradation degree based on the charging capacity.

As described above, the degradation estimation method of a high voltage battery according to an exemplary embodiment of the present disclosure may improve SOC accuracy by more accurately determining a durability/degradation state of a vehicle battery which performs slow charging like an EV and a PHEV, allow designing a battery diagnosis strategy based thereon, and reduce costs of a current sensor since accurate degradation may be detected even though a sense of a low specification is used in comparison to an existing technique.

While the present disclosure has been described in detail, it will be apparent to those skilled in the art that the scope of the present disclosure is not limited to the above description, and various changes and modifications may be made without departing from the spirit and scope of the disclosure as defined in the following claims.

What is claimed is:

1. A degradation estimation method of a battery, comprising:
    obtaining, by a controller of a slow charger, information regarding an input voltage (Vin), an input current (Iin) and an external temperature of a slow charger;
    calculating, by the controller of the slow charger, an output power (Pout) used for charging the battery, based on an input power (Pin) calculated based on the input voltage (Vin) and the input current (Iin);
    calculating, by the controller of the slow charger, a mean charging current (Icorr) based on the output power (Pout) and the battery charging voltage (Vbatt); and
    calculating, by the controller of the slow charger, a battery degradation degree based on the mean charging current (Icorr),
    wherein the mean charging current (Icorr) is calculated by the following equation: [the output power(Pout)/the battery charging voltage(Vbatt)] X the efficiency of the slow charger,
    wherein calculating the battery degradation degree includes:
    calculating, by the controller, a current charging capacity (Ah_aged) based on the mean charging current (Icorr); and
    calculating, by the controller, a battery degradation degree based on the current charging capacity (Ah_aged),
    wherein the current charging capacity (Ah_aged) is calculated by integrating a mean charging current (Icorr) in a voltage region substantially similar to an initial charging stage of the battery.

2. The degradation estimation method of a battery according to claim 1, wherein calculating the output power includes:
    obtaining, by the controller, efficiency with respect to the external temperature of the slow charger; and
    calculating, by the controller, an output power (Pout) by multiplying the efficiency and the input power (Pin).

3. The degradation estimation method of a battery according to claim 2, wherein the efficiency with respect to the external temperature of the slow charger is read from a table which has an external temperature as an input and efficiency of the slow charger as an output.

4. The degradation estimation method of a battery according to claim 1, wherein the battery degradation degree is calculated by the following equation:

$$100-[(\{\text{the current charging capacity }(Ah\_aged)/\text{an initial charging capacity }(Ah\_initial)\}\times 100].$$

5. The degradation estimation method of a battery according to claim 1, wherein the information is obtained when the battery charging voltage (Vbatt) enters a predetermined voltage region during the slow charging.

6. A degradation estimation method of a battery, comprising:
    obtaining, by a controller of a slow charger, information about an output voltage (Vout) and an output current (Tout) of a slow charger;
    calculating, by the controller of the slow charger, an output power (Pout) of the slow charger using the output voltage (Vout) and the output current (Tout);
    calculating, by the controller of the slow charger, a mean charging current (Icorr) with respect to the calculated output power (Pout); and
    calculating, by the controller of the slow charger, a battery degradation degree based on the mean charging current (Icorr),
    wherein the mean charging current (Icorr) with respect to the output power (Pout) is read from a map prepared in advance that uses an output power (Pout) as an input and a mean charging current (Icorr) as an output,
    wherein calculating the battery degradation degree includes:
    calculating, by the controller, a current charging capacity (Ah_aged) based on the mean charging current (Icorr); and
    calculating, by the controller, a battery degradation degree based on the current charging capacity (Ah_aged),
    wherein the current charging capacity (Ah_aged) is calculated by integrating a mean charging current (Icorr) in a voltage region substantially similar to an initial charging stage of the battery.

7. The degradation estimation method of a battery according to claim 6, wherein in the information is obtained when the battery charging voltage (Vbatt) enters a predetermined voltage region during the slow charging.

8. A degradation estimation system of a battery, comprising:
    a memory configured to store program instructions; and
    a processor configured to execute the program instructions, the program instructions when executed configured to:
    obtain information regarding an input voltage (Vin), an input current (Iin) and an external temperature of a slow charger;
    calculate an output power (Pout) used for charging the battery, based on an input power (Pin) calculated based on the input voltage (Vin) and the input current (Iin);
    calculate a mean charging current (Icorr) based on the output power (Pout) and the battery charging voltage (Vbatt); and
    calculate a battery degradation degree based on the mean charging current (Icorr)
    wherein the program instructions when executed to calculate the battery degradation degree are further configured to:

calculate a current charging capacity (Ah_aged) based on the mean charging current (Icorr); and calculate a battery degradation degree based on the current charging capacity (Ah_aged), and wherein the current charging capacity (Ah_aged) is calculated by integrating a mean charging current (Icorr) in a voltage region substantially similar to an initial charging stage of the battery.

9. The system of claim 8, wherein the program instructions when executed to calculate an output power are further configured to:

obtain efficiency with respect to the external temperature of the slow charger; and calculate an output power (Pout) by multiplying the efficiency and the input power (Pin).

10. The system of claim 9, wherein the efficiency with respect to the external temperature of the slow charger is read from a table which has an external temperature as an input and efficiency of the slow charger as an output.

11. The system of claim 8, wherein the mean charging current (Icorr) is calculated by the following equation:

[the output power (*P*out)/the battery charging voltage (*V*batt)]×the efficiency of the slow charger.

12. A non-transitory computer readable medium containing program instructions executed by a controller, the computer readable medium comprising:

program instructions that obtain information regarding an input voltage (Vin), an input current (Iin) and an external temperature of a slow charger;

program instructions that calculate an output power (Pout) used for charging the battery, based on an input power (Pin) calculated based on the input voltage (Vin) and the input current (Iin);

program instructions that calculate a mean charging current (Icorr) based on the output power (Pout) and the battery charging voltage (Vbatt);

program instructions that calculate a battery degradation degree based on the mean charging current (Icorr); and program instructions that calculate a battery degradation degree based on the mean charging current (Icorr), wherein the mean charging current (Icorr) is calculated by the following equation, [the output power(Pout)/the battery charging voltage(Vbatt)] X the efficiency of the slow charger, wherein calculating the battery degradation degree includes:

calculating, by the controller, a current charging capacity (Ah_aged) based on the mean charging current (Icorr); and calculating, by the controller, a battery degradation degree based on the current charging capacity (Ah_aged), wherein the current charging capacity (Ah_aged) is calculated by integrating a mean charging current (Icorr) in a voltage region substantially similar to an initial charging stage of the battery.

\* \* \* \* \*